(12) United States Patent
Oya

(10) Patent No.: US 6,558,580 B2
(45) Date of Patent: May 6, 2003

(54) CONDUCTIVE PASTE AND SOLAR CELL USING THE SAME

(75) Inventor: Hirohisa Oya, Omihachiman (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 09/767,217

(22) Filed: Jan. 22, 2001

(65) Prior Publication Data

US 2001/0029977 A1 Oct. 18, 2001

(30) Foreign Application Priority Data

Jan. 21, 2000 (JP) ........................................ 2000-012683

(51) Int. Cl.[7] .............................. H01B 1/22; H01B 1/16; H01L 31/00
(52) U.S. Cl. ................. 252/512; 252/518.1; 252/519.3; 136/256; 136/261
(58) Field of Search ............................... 136/256, 261; 252/512, 518.1, 521.3, 519.3

(56) References Cited

U.S. PATENT DOCUMENTS 4,940,959 A * 7/1990 Zeller et al. .................. 338/13
5,562,972 A * 10/1996 Sasaki ......................... 428/209

FOREIGN PATENT DOCUMENTS

| JP | 10-247418 A | * | 9/1998 |
| JP | 2000-90733 A | * | 3/2000 |
| JP | 2000-90734 A | * | 3/2000 |

OTHER PUBLICATIONS

Japanese Abstract 01057762, Jun. 19, 1989.
Derwent Abstract XP–002200777, Aug. 7, 1988.
EP Search Report dated Aug. 9, 2002.

* cited by examiner

Primary Examiner—Alan Diamond
(74) Attorney, Agent, or Firm—Dickstein, Shapiro, Morin & Oshinsky, LLP

(57) ABSTRACT

A conductive paste contains conductive powder and an organic vehicle. The conductive powder includes aluminum powder having an average particle diameter of about 2 to 10 μm and having an oxide layer with a thickness of about 2 to 10 nm on the surface thereof. A solar cell includes a silicon substrate having a light-accepting surface, a light-accepting-surface electrode formed on the light-accepting surface of the silicon substrate, and a back-surface electrode formed of the conductive paste described above.

6 Claims, 4 Drawing Sheets

CONDUCTIVE PASTE AND SOLAR CELL USING THE SAME

BACKGROUND OF THE INVENTION

1. Field of the Invention

The present invention relates to a conductive paste used for forming electrodes of ceramic electronic components, etc., and more particularly, the invention relates to a conductive paste which is suitable for use in forming back-surface electrodes of silicon solar cells, etc.

2. Description of the Related Art

In a typical conductive paste, conductive powder and glass frit are dispersed in an organic vehicle. In particular, when back-surface electrodes of silicon solar cells are formed, a conductive paste containing aluminum powder as a principal ingredient is used in order to secure ohmic contact with silicon substrates (Si wafers).

As shown in FIG. 1, a silicon solar cell 11 includes an Si wafer 12 consisting of a p-type silicon layer 12a and an n-type silicon layer 12b, a light-accepting-surface electrode 13 and an antireflection coating 14 formed on the light-accepting surface of the n-type silicon layer 12b, and a back-surface electrode 15 formed on the p-type silicon layer 12a.

In order to form the back-surface electrode 15, an electrode coating is formed by printing a conductive paste, in which aluminum powder 15a and glass frit are dispersed in an organic vehicle, on the side of the p-type silicon layer 12a of the Si wafer 12. The electrode coating is dried, and by firing at a temperature which is equal to or higher than the melting point of the aluminum powder, i.e., at 660° C. or higher, with a near-infrared heating oven in air, the organic component is removed and the aluminum powder 15a is sintered, and thus the back-surface electrode 15 containing aluminum as a principal ingredient is obtained.

In the firing process, as shown in FIG. 2, the back-surface electrode 15 reacts with the p-type silicon layer 12a to form an Al—Si alloy layer 12c. Furthermore, Al ions diffuse into the p-type silicon layer 12a through the Al—Si alloy layer 12c from the back-surface electrode 15, and thus a p$^+$ electrolytic layer 12d is formed. The Al—Si alloy layer 12c and the p$^+$ electrolytic layer 12d secure ohmic contact between the back-surface electrode 15 and the p-type silicon layer 12a and also improve the characteristics of the solar cell. For example, the reflection efficiency of long-wavelength light is improved, electrons are prevented from being recombined in the wafer, and the internal electric field is improved.

In general, aluminum powder is easily oxidized, and in the conductive paste described above, the surface of the aluminum powder is covered by an oxide layer. Conventionally, the oxide layer on the surface of aluminum powder is not particularly controlled, and particles of the aluminum powder have different degrees of oxidation in the surfaces thereof.

The aluminum powder 15a covered by the oxide film has insufficient reactivity with silicon. Moreover, when firing is performed in air, since the thickness of the oxide film increases according to the diffusion law, the reactivity with silicon is further decreased. Additionally, since the surface of the Si wafer 12 has a texture structure composed of pyramidal irregularities on the order of several to 10 micrometers, a space occurs between the aluminum powder and the Si wafer 12, and the contact area between the aluminum powder 15a in the back-surface electrode 15 and the p-type silicon layer 12a, i.e., the area where the alloying reaction begins, is reduced. Furthermore, the firing operation of the back-surface electrode 15 is completed in a short period of time, such as over several minutes, in order to inhibit the diffusion of impurities, such as glass components, which adversely affect the characteristics.

As a result, reaction and diffusion at the interface between the back-surface electrode 15 and the p-type silicon layer 12a do not proceed sufficiently, and as indicated by a position 16 in FIG. 2, a region is produced in which the Al—Si alloy layer 12c and the p$^+$ electrolytic layer 12d are insufficiently formed. That is, there are limitations on the coverage in the interface direction of the back-surface electrode, and the fill factor (FF) which is the curve factor of the V-I characteristics of a solar cell, the short-circuit current (Isc) and the open-circuit voltage (Voc) may not be improved, resulting in a difficulty in obtaining a desired conversion efficiency (Eff).

In the Al—Si alloy layer 12c and the p$^+$ electrolytic layer 12d formed by the conductive paste having aluminum powder as a principal ingredient, the degree of oxidation of the aluminum powder depends on the thickness of the back-surface electrode 15 under the influence of the oxygen partial pressure in the vicinity of the interface between the back-surface electrode 15 and the p-type silicon layer 12a. That is, if the thickness of the back-surface electrode 15 is decreased, the oxygen partial pressure at the interface is increased and the reactivity of the back-surface electrode 15 is decreased, and thus the formation of the Al—Si alloy layer 12c and the p$^+$ electrolytic layer 12d is inhibited, resulting in the problems as described above.

SUMMARY OF THE INVENTION

Accordingly, it is an object of the present invention to provide a conductive paste used for producing a silicon solar cell in which high efficiency can be achieved, and the thickness of a back-surface electrode and the thickness of an Si wafer can be decreased, and which can reduce the costs of the silicon solar cell.

In one aspect of the present invention, a conductive paste contains conductive powder and an organic vehicle. The conductive powder includes aluminum powder having an average particle diameter of about 2 to 10 μm and having an oxide layer with a thickness of about 2 to 10 nm on the surface thereof.

In another aspect of the present invention, a solar cell includes a silicon substrate having a light-accepting surface, a light-accepting-surface electrode formed on the light-accepting surface of the silicon substrate, and a back-surface electrode formed of a conductive paste of the present invention on an opposite surface to the light-accepting surface of the silicon substrate.

The aluminum powder which is used for a conductive paste of the present invention has an average particle diameter of about 2 to 10 μm. By using the aluminum powder having an average particle diameter of about 2 to 10 μm, since the Al—Si contact area is increased regardless of the irregular structure of an Si wafer, a uniform alloy layer can be formed in the interface direction, and thus the coverage of the alloy layer can be increased. However, when the average particle diameter of the aluminum powder is less than about 2 μm, since the volumetric ratio of oxides in the aluminum powder is increased and the electrode resistivity increases, the wiring resistance of the silicon solar cell increases, resulting in degradation in the characteristics of the silicon solar cell, which is disadvantageous. On the other hand, when the average particle diameter of the aluminum powder exceeds about 10 μm, since the Al—Si contact area is not sufficiently secured, the coverage of the alloy layer is decreased.

In the aluminum powder used for the conductive paste of the present invention, an oxide layer thereof has a thickness of about 2 to 10 μm. The alloying reaction between Al and Si takes place at a high temperature of about 600° C. or more. In general, when aluminum powder is heated in air, the thickness of the oxide layer increases over time according to the parabolic rule. Therefore, in order to increase the coverage of the Al—Si alloy layer, the thickness of the oxide layer of the aluminum powder, which blocks the alloying reaction, is preferably set to be minimized in the initial state before heating. By using the aluminum powder having the oxide layer with a thickness of about 2 to 10 nm, it is possible to promote the Al—Si alloying reaction in a broader temperature range of firing, and thus it is possible to achieve a high coverage of the alloy layer. However, when the thickness of the oxide layer is less than about 2 nm, an excessive alloying reaction may cause the formation of Al—Si agglomerates or structural defects, such as cracking of the Si wafer. When the thickness of the oxide layer exceeds about 10 nm, for the reason described above, the Al—Si alloying reaction is not promoted.

Preferably, the conductive powder includes the aluminum powder in an amount of about 80% by weight or more. More preferably, the conductive powder is nearly entirely composed of the aluminum powder. In the conventional aluminum powder, the thickness and uniformity of the oxide layer are not controlled. In contrast, in accordance with the present invention, the conductive paste contains the aluminum powder having an average particle diameter of about 2 to 10 μm and having an oxide layer with a thickness of about 2 to 10 nm on the surface thereof as a principal ingredient, and the thickness of the oxide layer of the aluminum powder is controlled. In a silicon solar cell provided with a back-surface electrode which is formed using such a conductive paste, a high conversion efficiency can be achieved.

The content of the aluminum powder of the present invention in the total amount of aluminum powder constituting the conductive paste of the present invention is not specifically limited. That is, in response to the desired characteristics of the silicon solar cell, the thickness of the back-surface electrode or material costs, it is possible to adjust the reactivity of the Al electrode by appropriately blending aluminum powders having different average particle diameters and having oxide layers with different thicknesses.

As the organic vehicle contained in the conductive paste of the present invention, an organic vehicle in which a cellulose-based resin, such as ethyl cellulose or nitrocellulose, an alkyd resin, or an acrylic resin is dissolved in a solvent, such as terpineol, Carbitol or Cellosolve, may be used. However, the organic vehicle is not limited thereto.

The conductive paste of the present invention may further contain glass frit. As the glass frit, for example, PbO—$B_2O_3$—$SiO_2$-based glass or $Bi_2O_3$—$B_2O_3$—$SiO_2$-based glass may be used. However, the glass frit is not limited thereto.

DESCRIPTION OF THE PREFERRED EMBODIMENTS

A silicon solar cell in an embodiment of the present invention will be described with reference to FIGS. 3 and 4.

Figure 1:
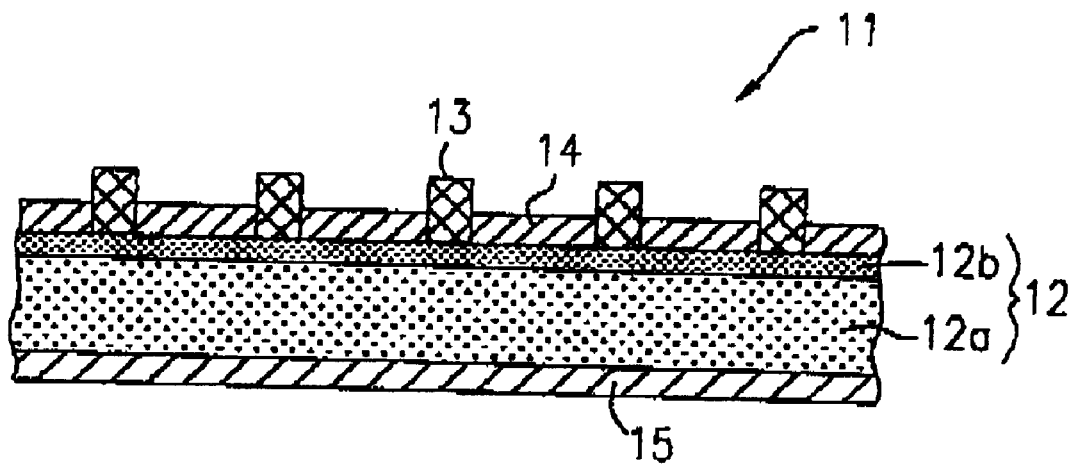
FIG. 1 is a sectional view which schematically shows a silicon solar cell in which a back-surface electrode is formed using a conventional conductive paste.
Figure 2:
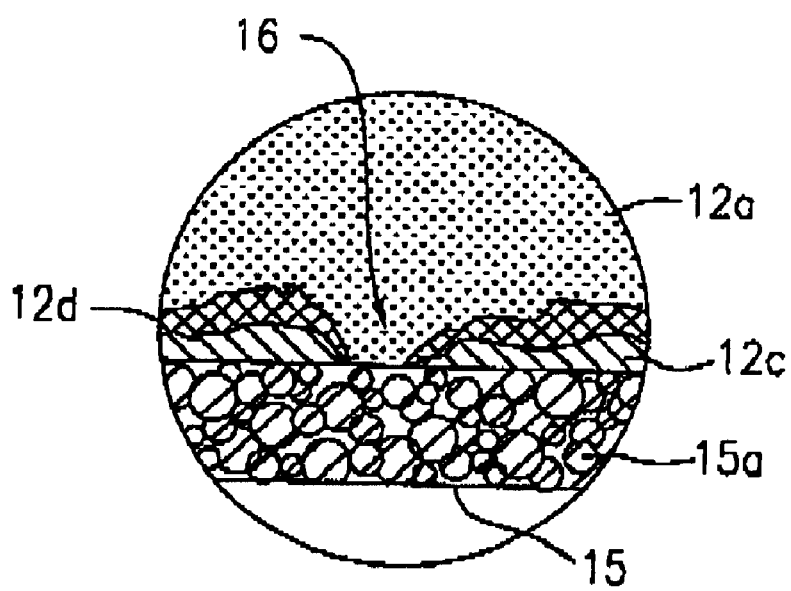
FIG. 2 is an enlarged sectional view of the interface between a p-type silicon layer and the back-surface electrode in the silicon solar cell shown in FIG. 1.
Figure 3:
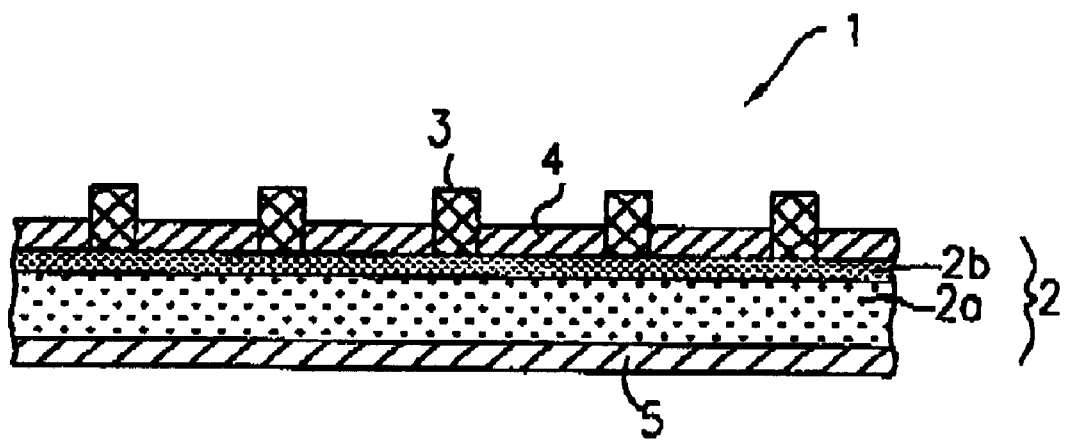
FIG. 3 is a sectional view which schematically shows a silicon solar cell in which a back-surface electrode is formed using a conductive paste in an embodiment of the present invention.
Figure 4:
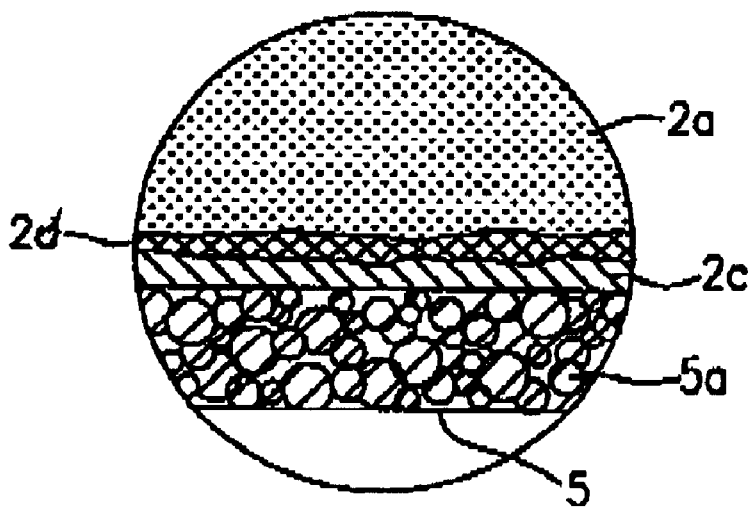
FIG. 4 is an enlarged sectional view of the interface between a p-type silicon layer and the back-surface electrode in the silicon solar cell shown in FIG. 3.

As shown in FIG. 3, a silicon solar cell 1 includes an Si wafer 2 consisting of a p-type silicon layer 2a and an n-type silicon layer 2b, a light-accepting-surface electrode 3 and an antireflection coating 4 formed on the light-accepting surface of the Si wafer 2, and a back-surface electrode 5 formed on a surface opposite to the light-accepting surface. The light-accepting-surface electrode 3 and the antireflecting coating 4 are formed on the principal surface of the Si wafer 2 on the side of the n-type silicon layer 2b. In order to produce the back-surface electrode 5, a conductive film is formed on the principal surface of the Si wafer 2 on the side of the p-type silicon layer 2a using a conductive paste of the present invention, followed by firing. As shown in FIG. 4, during firing, Al in the back-surface electrode 5 reacts with the p-type silicon layer 2a to form an Al—Si alloy layer 2c at the interface between the back-surface electrode 5 and the p-type silicon layer 2a on the side of the p-type silicon layer 2a, and Al ions diffuse into the p-type silicon layer 2 through the Al—Si alloy layer 2c to form a $p^+$ electrolytic layer 2d.

The back-surface electrode 5 is formed using a conductive paste of the present invention which contains aluminum powder 5a having an average particle diameter of about 2 to 10 μm and having an oxide layer with a thickness of about 2 to 10 nm. Therefore, Al—Si agglomerates due to excessive alloying reaction are not produced, and regardless of the irregular structure of the Si wafer, the Al—Si contact area is increased, and thus the Al—Si alloy layer 2c and the $p^+$ electrolytic layer 2d having sufficient thicknesses are formed.

Additionally, in the silicon solar cell 1 of the present invention, the shapes of the light-accepting-surface electrode 3 and the antireflection coating 4 are not limited those described above in the embodiment.

EXAMPLES

First, aluminum powders having the average particle diameter and the thickness of oxide layer as shown in Table 1 were prepared for Examples 1 to 9 and Comparative Examples 1 to 5. Additionally, the average particle diameters of the aluminum powders were measured by a laser diffraction-scattering-type particle size distribution tester, using a mixed solvent of ethanol and isopropyl alcohol as a dispersion medium. The thickness of the oxide layer of the aluminum powder was determined by dividing the amount of oxide in the aluminum powder by the specific surface area thereof. The amount of oxide was measured by a method in which a predetermined amount of aluminum powder was heated in a carbon crucible to 2,000° C. or more in air, and the amount of carbon dioxide generated was determined. The specific surface area was measured by the BET method.

TABLE 1

| Sample | Average Particle Diameter ($\mu$m) | Thickness of Oxide Layer (nm) |
|---|---|---|
| Example | | |
| 1 | 2.5 | 3.6 |
| 2 | 4.0 | 2.8 |
| 3 | 6.2 | 4.1 |
| 4 | 7.8 | 3.3 |
| 5 | 3.0 | 6.5 |
| 6 | 6.1 | 7.7 |
| 7 | 9.2 | 6.7 |
| 8 | 4.5 | 9.5 |
| 9 | 8.8 | 9.0 |
| Comparative Example | | |
| 1 | 1.8 | 5.8 |
| 2 | 6.0 | 1.5 |
| 3 | 8.2 | 11.6 |
| 4 | 12.5 | 5.0 |
| 5 | 11.3 | 13.4 |

Next, 70% by weight of the aluminum powder in each of Examples 1 to 9 and Comparative Examples 1 to 5, 2.5% by weight of PbO—$B_2O_3$—$SiO_2$-based glass frit having an average particle diameter of 1 $\mu$m and a softening point of 585° C., and 27.5% by weight of an organic vehicle in which a nitrocellulose resin and an alkyd resin were dissolved in α-terpineol, were prepared and kneaded by a triple roll mill, and thus conductive pastes in Examples 1 to 9 and Comparative Examples 1 to 5 were obtained. The conductive powders in the individual conductive pastes were composed of 100% of the aluminum powders shown in Table 1.

Next, electrode coatings were formed by screen printing on 350 $\mu$m thick Si wafers of predetermined sizes using the conductive pastes in Examples 1 to 9 and Comparative Examples 1 to 5, followed by drying at 150° C. Firing was then performed in a near-infrared heating oven at a maximum temperature of 750° C. to form back-surface electrodes, and thus test samples in Examples 1 to 9 and Comparative Examples 1 to 5 were obtained. In order to evaluate the characteristics, 3 types of test samples described below were produced.

In order to form each sample for measuring resistivity, a line electrode composed of a bent line with a width of 400 $\mu$m and an overall length of 200 mm was formed on an Si wafer with a size of 40 mm×20 mm. The resistivity was obtained by measuring the electrical resistance between line electrodes and the thickness of the electrodes for each sample in Examples 1 to 9 and Comparative Examples 1 to 5, and the results thereof are summarized in Table 2.

Figure 5:
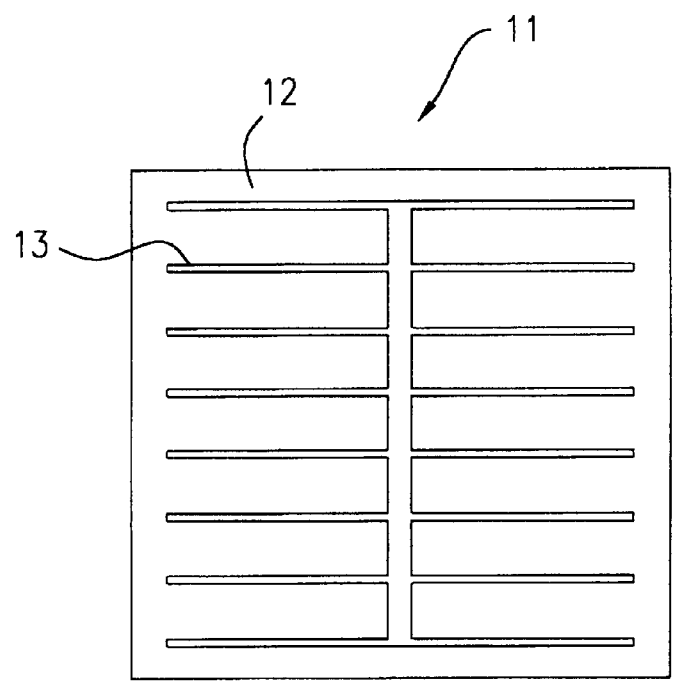
FIGS. 5 and 6 are a top plan view and a bottom plan view, respectively, which schematically show a sample for measuring resistivity in examples and comparative examples in the present invention.
Figure 6:
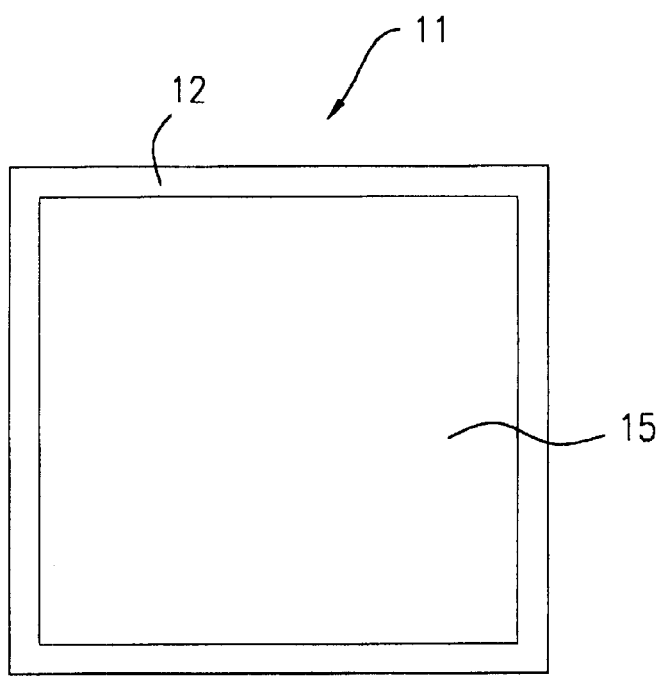

In order to form each sample 11 for measuring conversion efficiency (Eff), as shown in FIG. 5, an Si wafer 12 (14 mm by 14 mm square) consisting of a pn junction was prepared, and a light-accepting-surface electrode 13 composed of Ag was formed in a comb-like pattern on an n-type Si surface. A back-surface electrode 15 composed of Al was formed substantially entirely over a p-type Si surface. The conversion efficiency (Eff) was measured by a solar simulator (AM 1.5) at 25° C. for each sample in Examples 1 to 9 and Comparative Examples 1 to 5, and the results thereof are summarized in Table 2.

In order to form each sample for measuring the coverage of the Al—Si alloy layer and for evaluating structural defects, an Si wafer with a size of 40 mm×20 mm consisting of a pn junction was prepared, and a back-surface electrode composed of Al was formed substantially entirely over a p-type Si surface so as to have a thickness of 50 $\mu$m. With respect to the structural defects, the appearance of the back-surface electrode after firing was observed to check the presence of agglomerates in the Al—Si alloy layer, protrusions, and cracking of the back-surface electrode. With respect to the coverage of the Al—Si alloy layer, each sample in Examples 1 to 9 and Comparative Examples 1 to 5 was immersed in a 20% HCl aqueous solution to etch the back-surface electrode, and the state of the exposed Al—Si alloy layer was observed by an optical microscope. The coverage of the Al—Si alloy layer at the interface with the back-surface electrode was obtained by image analysis, and the results thereof are summarized in Table 2.

Figure 7:
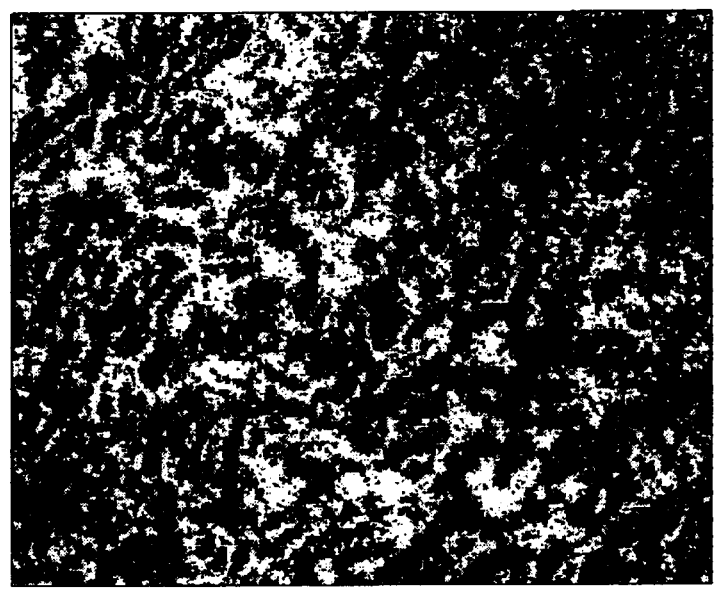
FIG. 7 is a representation of a micrograph which shows an interface between an Si wafer and a back-surface electrode in a sample for measuring the coverage of an Al—Si alloy layer in Example 1 of the present invention.
Figure 8:
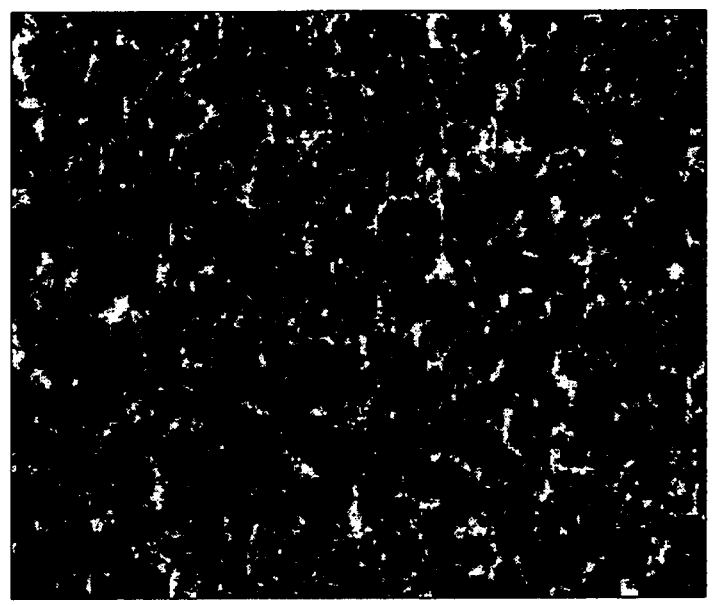
FIG. 8 is a representation of a micrograph which shows an interface between an Si wafer and a back-surface electrode in a sample for measuring the coverage of an Al—Si alloy layer in Comparative Example 4 of the present invention.

With respect to Example 1 and Comparative Example 4, micrographs of exposed Al—Si alloy layers were taken, representations of which are shown in FIGS. 7 and 8, respectively. In FIGS. 3 and 4, the Al—Si alloy layers are shown by white regions and unreacted p-type silicon layers are shown as black spots. That is, as the amount of the black spots is decreased, the p-type silicon layer is much more covered by the Al—Si alloy layer.

TABLE 2

| Sample | Electrode Resistivity ($\mu\Omega \cdot$ cm) | Coverage of Al—Si Alloy Layer (%) | Conversion Efficiency Eff (%) | Structural Defects | Evaluation |
|---|---|---|---|---|---|
| Example | | | | | |
| 1 | 40 | 95 | 15.0 | Not observed | ◦ |
| 2 | 32 | 92 | 15.0 | Not observed | ◦ |
| 3 | 24 | 85 | 14.8 | Not observed | ◦ |
| 4 | 22 | 80 | 14.8 | Not observed | ◦ |
| 5 | 45 | 90 | 14.9 | Not observed | ◦ |
| 6 | 35 | 86 | 14.7 | Not observed | ◦ |
| 7 | 30 | 70 | 14.8 | Not observed | ◦ |
| 8 | 48 | 78 | 14.6 | Not observed | ◦ |
| 9 | 36 | 65 | 14.5 | Not observed | ◦ |
| Comparative Example | | | | | |
| 1 | 85 | 85 | 13.9 | Agglomerates in some parts | x |
| 2 | 20 | 95 | 14.8 | Agglomerates Protrusions | x |

TABLE 2-continued

| Sample | Electrode Resistivity ($\mu\Omega \cdot$ cm) | Coverage of Al—Si Alloy Layer (%) | Conversion Efficiency Eff (%) | Structural Defects | Evaluation |
|---|---|---|---|---|---|
| 3 | 45 | 48 | 13.7 | Not observed | x |
| 4 | 25 | 40 | 13.8 | Not observed | x |
| 5 | 40 | 15 | 13.5 | Not observed | x | o Satisfactory
x Inferior

As is clear from Table 2, in the samples of Examples 1 to 9 in which the aluminum powder had an average particle diameter of about 2 to 10 μm and had an oxide layer with a thickness of about 2 to 10 nm, the electrode resistivity was in the range of 22 to 48 μΩ·cm, and the coverage of the Al—Si alloy layer was in the range of 65% to 95%, no structural defects were observed and the conversion efficiency (Eff) was excellent in the range of 14.5% to 15.0%.

In contrast, the sample of Comparative Example 1 in which the aluminum powder had an average particle diameter of less than 2 μm, had a high electrode resistivity of 85 μΩ·cm, which was inferior, and also structural defects due to the occurrence of agglomerates were observed in some parts of the back-surface electrode.

In the sample of Comparative Example 2, although the electrode resistivity was excellent at 20 μΩcm, structural defects due to agglomerates and protrusions were observed in the back-surface electrode.

In the sample of Comparative Example 3 in which the thickness of the oxide layer exceeded 10 nm, since the coverage of the Al—Si alloy layer was low at 48%, the conversion efficiency (Eff) was decreased to 13.7%.

In the sample of Comparative Example 4 in which the aluminum powder had an average particle diameter of more than 10 μm, although the electrode resistivity was low at 25 μΩ·cm, since the coverage of the Al—Si alloy layer was low at 40%, the conversion efficiency (Eff) was decreased to 13.8%.

In the sample of Comparative Example 5 in which the aluminum powder had an average particle diameter of more than 10 μm and the oxide layer had a thickness of more than 10 nm, the coverage of Al—Si alloy layer was very low at 15%, which was out of the range of the present invention.

As described above, by using the conductive pastes of Examples 1 to 9, it was possible to improve the coverage of the Al—Si alloy layers without increasing electrode resistivity and without causing structural defects after firing, and thus it was confirmed that higher conversion efficiency (Eff) could be obtained in comparison with the conductive pastes in Comparative Examples 1 to 5.

Next, by using the conductive pastes in Example 2 and Comparative Example 3, back-surface electrodes with thicknesses of 20 μm, 30 μm, 40 μm and 50 μm were formed in a manner similar to that of the samples described above, and the coverage of Al—Si alloy layers and the conversion efficiency were measured. The results thereof are summarized in Table 3.

TABLE 3

| | Characteristics | | | |
|---|---|---|---|---|
| | Example 2 | | Comparative Example 3 | |
| Thickness of Al Electrode | Coverage of Al—Si Alloy Layer (%) | Conversion Efficiency (%) | Coverage of Al—Si Alloy Layer (%) | Conversion Efficiency (%) |
| 50 μm | 92 | 15.0 | 48 | 13.7 |
| 40 μm | 84 | 14.9 | 30 | 13.6 |
| 30 μm | 72 | 14.7 | 18 | 13.5 |
| 20 μm | 55 | 14.0 | 12 | 13.2 |

As is obvious from Table 3, even if the thickness of the back-surface electrode in the sample of Example 2 was small at 20 μm, the coverage of the Al—Si alloy layer was 55% and the conversion efficiency (Eff) was 14.0%, exhibiting practical silicon solar cell characteristics. Therefore, the thickness of the back-surface electrode can be decreased, and also the thickness of the Si wafer can be decreased by stress relaxation.

In contrast, even if the thickness of the back-surface electrode in the sample of Comparative Example 3 was large at 50 μm, the coverage of the Al—Si alloy layer was 48% and the conversion efficiency (Eff) was 13.7%. When the thickness was small at 20 μm, the coverage of the Al—Si alloy layer was extremely low at 12%, and consequently, the conversion efficiency (Eff) was decreased to 13.2%.

As described above, as the thickness of the back-surface electrode is decreased, the coverage of the Al—Si alloy layer is decreased, and the conversion efficiency (Eff) is decreased. However, it has been found that when a back-surface electrode is formed using the conductive paste of the present invention, even if the thickness as small as 20 μm, it is possible to obtain the conversion efficiency which is acceptable as a practical silicon solar cell.

Using the conductive paste of the present invention in a silicon solar cell provided with the back-surface electrode, high conversion efficiency can be achieved, and also the thickness of the back-surface electrode and the thickness of the Si wafer can be decreased, and thus the size of the silicon solar cell can be reduced and the costs of the silicon solar cell can be reduced.

With a silicon solar cell in which the back-surface electrode is formed using the conductive paste of the present invention, specifically, in a silicon solar cell including the Si wafer consisting of the n-type silicon layer and the p-type silicon layer, the light-accepting-surface electrode and the antireflecting coating formed on the principal surface of the Si wafer on the side of the n-type silicon layer, and the back-surface electrode formed on the principal surface of the Si wafer on the side of the p-type silicon layer, in which the back-surface electrode is formed by forming the electrode film on the principal surface of the Si wafer on the side of the p-type silicon layer using the conductive paste of the present invention, followed by firing, Al—Si agglomerates due to the excessive alloying reaction do not occur, and regardless of the irregular structure of the Si wafer, the Al—Si contact area can be increased, and the Al—Si alloy layer and $p^+$ electrolytic layer with sufficient thicknesses can be formed. Therefore, high conversion efficiency and low costs can be achieved.

What is claimed is:

1. A conductive paste for making an electrode of a solar cell comprising:

a conductive powder comprising aluminum powder having an average particle diameter of about 2 to 10 μm and having an oxide layer with a thickness of about 2 to 10 nm on the surface thereof and an organic vehicle.

2. A conductive paste according to claim 1, wherein the aluminum powder occupies at least about 80% by weight of the conductive powder.

3. A conductive paste according to claim 2, wherein the conductive powder is substantially 100% by weight of the aluminum powder.

4. A conductive paste according to claim 3, further comprising glass frit.

5. A conductive paste according to claim 2, further comprising glass frit.

6. A conductive paste according to claim 1, further comprising glass frit.

* * * * *